United States Patent [19]

Lewandowski et al.

[11] Patent Number: 4,484,308
[45] Date of Patent: Nov. 20, 1984

[54] SERIAL DATA MODE CIRCUIT FOR A MEMORY

[75] Inventors: Alan J. Lewandowski; Jerry D. Moench, both of Austin, Tex.

[73] Assignee: Motorola, Inc., Schaumburg, Ill.

[21] Appl. No.: 422,047

[22] Filed: Sep. 23, 1982

[51] Int. Cl.³ .............................................. G06F 1/04
[52] U.S. Cl. .................................... 364/900; 364/200
[58] Field of Search .................. 365/189; 364/200, 900

[56] References Cited

U.S. PATENT DOCUMENTS

| | | | |
|---|---|---|---|
| 4,079,456 | 3/1978 | Lunsford et al. | 364/200 |
| 4,344,156 | 8/1982 | Eaton, Jr. et al. | 365/189 |
| 4,365,295 | 12/1982 | Katzman et al. | 364/200 |
| 4,366,558 | 12/1982 | Homma et al. | 365/189 |

Primary Examiner—Jerry Smith
Assistant Examiner—Michael R. Fleming
Attorney, Agent, or Firm—James L. Clingan, Jr.

[57] ABSTRACT

A serial data mode circuit, which provides valid data on a falling edge of a data valid signal, uses time between falling edges to prepare for the next falling edge in order to reduce the time between when a falling edge of the data valid signal occurs and when data actually becomes valid. A plurality of interconnected flip-flops selectively enable data latches containing data in response to a rising edge of the data valid signal. The data is then provided to a tri-state driver prior to the falling edge of the data valid signal. The tri-state driver is then enabled in response to the falling edge of the data valid signal.

6 Claims, 3 Drawing Figures

SERIAL DATA MODE CIRCUIT FOR A MEMORY

This invention relates to memory circuits, and more particularly to memory circuits for providing serial data in response to an address signal.

BACKGROUND OF THE INVENTION

In dynamic random access memories (DRAMs), typically a single data bit is accessed by a multiplexed row and column address. A row address is received, then a column address is received, both received on the same address pins. This minimizes the number of required pins and the package size. The multiplexing, however, does require more time than for receiving both the row and the column address at the same time. A page mode was introduced whereby a row address would be received then a plurality of consecutive column addresses was received so that a data bit for each column address was provided. This saved time in that a new row address did not have to be received for each new data bit.

A further improvement in speed has been introduced called the nibble mode. For a single row and column address, four consecutive data bits are provided serially. This is a further saving in time not only because only one row address and column address are required but also because all four bits are sensed at the same time and held in respective data latches until serially clocked out in a predetermined sequence. In the page mode, for each new column address, the data bit had to first be transmitted from a latched sense amplifier before it was clocked to the output. A nibble mode circuit is shown in an article entitled "A 100ns 64K Dynamic RAM Using Redundancy Techniques," ISSCC 81, WPM 8.3, pp. 84-85 and U.S. Pat. No. 4,344,156, Eaton, Jr. et al. The circuit described therein uses standard dynamic techniques to achieve the nibble mode.

A complementary row address signal ($\overline{RAS}$) goes to a logic low and a row address is received. A complementary column address signal ($\overline{CAS}$) goes to a logic low and a column address is received. This causes a data bit to be provided. This is the conventional method for obtaining a single bit. $\overline{CAS}$ is then brought to a logic high while keeping $\overline{RAS}$ at a logic low. This is the method used to establish the nibble mode. In normal operation both $\overline{RAS}$ and $\overline{CAS}$ are brought to a logic high to prepare for the next row and column address. In the nibble mode, when $\overline{CAS}$ is brought to a logic low for the second time, the second data bit in the predetermined sequence is provided. $\overline{CAS}$ is then brought to a logic high and back to a logic low for the third time to cause the third data bit in the predetermined sequence to be provided. $\overline{CAS}$ is again brought to a logic high and back to a logic low to cause the fourth data bit in the predetermined sequence to be provided. The nibble mode can be terminated at any time by bringing $\overline{RAS}$ to a logic high. Each of the four data bits are accessed in response to receiving the row and column address signal and stored in a respective data latch. Upon a falling edge of $\overline{CAS}$, the selected data bit is clocked out of the latch, clocked through a data buffer, then out a tri-state driver. Because an output is only valid after $\overline{CAS}$ is at a logic low, the conventional technique is to begin clocking data out of the data latch and through the data buffer upon the falling edge of $\overline{CAS}$. Additionally in DRAMs, a dynamic data buffer is typically used. Such a buffer provides an output in response to a signal generated from $\overline{CAS}$. This signal clocks the output through the buffer to a tri-state driver subsequent to the falling edge of $\overline{CAS}$. Using these conventional dynamic techniques, however, does require taking time for the data bit to propagate from the data latch to the input of the tri-state driver after the falling edge of $\overline{CAS}$. Accordingly, there is a delay in the access time from when $\overline{CAS}$ goes to a logic low and when the output is valid.

SUMMARY OF THE INVENTION

An object of this invention is to provide an improved circuit for providing serial data from a memory.

Another object of the invention is to improve the access time in the nibble mode.

Yet another object is to clock data to the input of a tri-state driver on a rising edge of $\overline{CAS}$.

These and other objects are achieved in accordance with the invention by providing in a memory for providing serial data in response to a single address, a circuit comprising: output buffer means for providing data received on a data bus on an output in response to a data valid signal; a plurality of data latches coupled to the data bus, each data latch containing data which is coupled to the data bus in response to respective data latch enable signals; and a plurality of inter-connected flip-flops for providing respective data enable signals to the plurality of data latches in a predetermined sequence. A particular data latch is enabled by a respective data latch enable signal sufficiently prior to the output buffer receiving the data valid signal so that the output buffer has received the data contained in the particular data latch prior to receiving the data valid signal. This is a method for providing serial data from a memory in response to an address wherein a signal having a continuous series of pulses is used to gate the data received from a plurality of data latches through an output driver, comprising: enabling a predetermined data latch on a first edge of one of the pulses so that data is provided to the output driver from the predetermined data latch, and providing valid data from the output driver on a second edge of one of the pulses.

DESCRIPTION OF A PREFERRED EMBODIMENT

Figure 1:
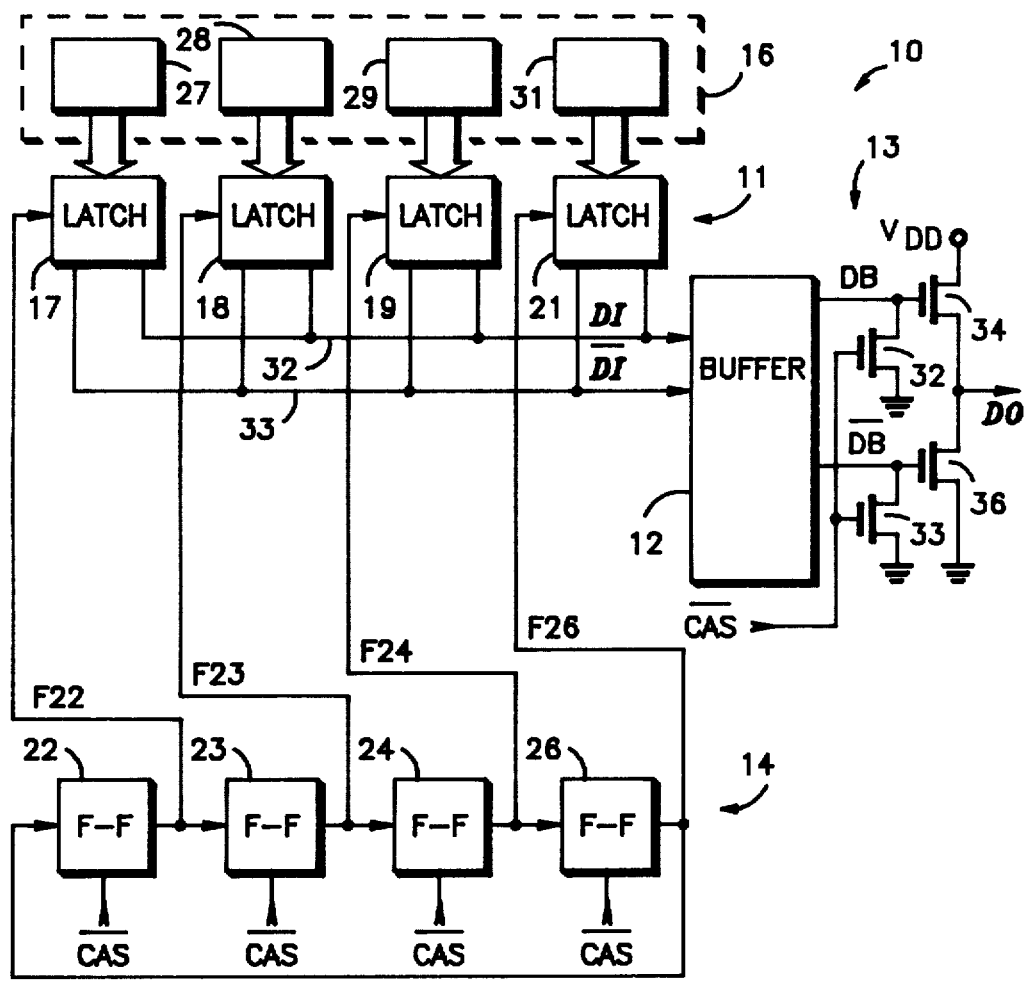
FIG. 1 is a block diagram of a nibble mode circuit according to a preferred embodiment of the invention.

Shown in FIG. 1 is a nibble mode circuit 10 for a memory comprised generally of a plurality of data latches 11, a data buffer 12, a tri-state driver 13, a plurality of interconnected flip-flops 14, and a memory array 16. Plurality of data latches 11 is comprised of a data latch 17, a data latch 18, a data latch 19, and a data latch 21. Plurality of flip-flops 14 is comprised of a flip-flop 22, a flip-flop 23, a flip-flop 24, and a flip-flop 26. Memory array 16 is comprised of a first quadrant 27, a second quadrant 28, a third quadrant 29, and a fourth quadrant 31. Tri-state driver 13 is comprised of a transistor 32, a transistor 33, a transistor 34, and a transistor 36. Each transistor described herein is an enhancement mode N channel insulated gate FET having a gate, drain, and source and a threshold voltage of 0.5 to 0.9 volt.

Each flip-flop 22, 23, 24 and 26 has an output for providing a data enable signal F22, F23, F24 and F26, respectively. Flip-flop 22 has a first input connected to the output of flip-flop 26, to receive signal F26, and a second input connected to receive $\overline{CAS}$. Flip-flop 23 has a first input connected to the output of flip-flop 22 to receive signal F22, and a second input connected to receive $\overline{CAS}$. Flip-flop 24 has a first input connected to the output of flip-flop 23 to receive signal F23, and a second input connected to receive $\overline{CAS}$. Flip-flop 26 has a first input connected to the output of flip-flop 24 to receive signal F24, and a second input connected to receive $\overline{CAS}$.

Transistor 34 has a drain connected to a positive power supply terminal $V_{DD}$ for receiving a positive power supply voltage of, for example, 5 volts. Transistor 32 has a drain connected to the gate of transistor 34 a source connected to ground, and a gate for receiving a column address signal $\overline{CAS}$. Transistor 33 has a gate for receiving $\overline{CAS}$, a source connected to ground, and a drain connected to the gate of transistor 36. Transistor 36 has a drain connected to the source of transistor 34 to form an output node for providing an output data signal DO. Memory quadrants 27, 28, 29 and 31 are coupled to data latches 17, 18, 19 and 21, respectively. In response to a single address, each memory quadrant 27, 28, 29 and 31 provides a data bit to its respective data latch 17, 18, 19 and 21 where it is latched. Each data latch is coupled to a pair of data bus lines 32 and 33 for carrying internal data signals DI and $\overline{DI}$, respectively. Flip-flops 22, 23, 24 and 26 provide data enable signals F22, F23, F24 and F26, respectively, to corresponding data latches 17, 18, 19 and 21, respectively, for selectively enabling the corresponding data latch. Included in each flip-flop 22, 23, 24 and 26 is a decoder portion which causes one of flip-flops 22, 23, 24 and 26 to enable the corresponding data latch 17, 18, 19, or 21 in response to an address. The enabled data latch 17, 18, 19, or 21 provides data signals DI and $\overline{DI}$ on data bus lines 32 and 33 which are connected to output buffer 12. Output buffer 12 provides buffered data signals DB and $\overline{DB}$ to the gates of transistors 34 and 36, respectively. Buffered data signals DB and $\overline{DB}$ are inhibited from driving transistors 34 and 36 by transistors 32 and 33 until $\overline{CAS}$ is brought to a logic low at which time one of the transistors 34 and 36 will be turned on by buffered data signals DB and $\overline{DB}$ to provide data output signal DO. When $\overline{CAS}$ is at a logic high both transistors 34 and 36 are turned off by transistors 32 and 33. Consequently, tri-state driver 13 provides valid data in response to $\overline{CAS}$ being brought to a logic low and provides a high impedance output, in response to $\overline{CAS}$ being a logic high.

Figure 3:
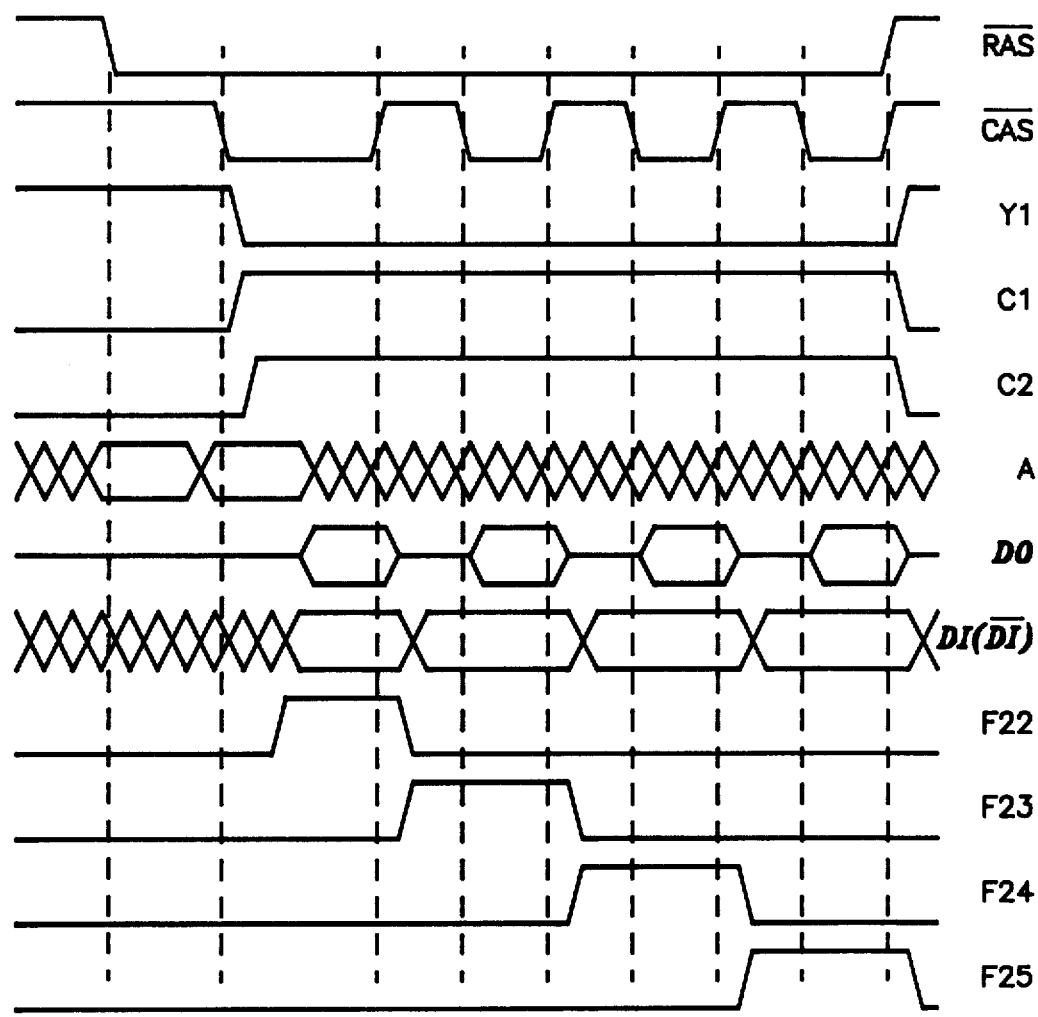
FIG. 3 is a diagram of some signals relating to the preferred embodiment of FIG. 1.

Shown in FIG. 3 is a timing diagram of signals relevant to the operation of circuit 10 of FIG. 1 for the case where the address first selects flip-flop 22. Address signal A must provide a valid address for a predetermined time following the falling edge of $\overline{RAS}$ to establish the row address. Address signal A then switches to the column address which also must remain valid for a predetermined time following the falling edge of $\overline{CAS}$. $\overline{CAS}$ and $\overline{RAS}$ both remain at a logic low long enough for the output data, signal DO, to become valid.

In the nibble mode $\overline{RAS}$ remains at a logic low while $\overline{CAS}$ switches between a logic high and a logic low. For the case where the address selects flip-flop 22, the data from first quadrant 27 is coupled to the output as signal DO via data latch 17 which is enabled by signal F22 generated by flip-flop 22 in response to the address, output buffer 12, and tri-state driver 13. At the time first quadrant 27 provides a data bit to data latch 17, quadrants 28, 29, and 31 provide a data bit to data latches 18, 19 and 21. When $\overline{CAS}$ goes to a logic high, the output of flip-flop 23, signal F23, switches from a logic low to a logic high. In addition flip-flop 23 causes signal F22 to switch to a logic low when signal F23 switches to a logic high. Signal F23 at a logic high enables latch 18 so that latch 28 provides the data bit stored therein on data lines 32 and 33 to output buffer 12. Output buffer 12 drives signals DB and $\overline{DB}$ into tri-state driver 13. With $\overline{CAS}$ at a logic high, transistors 32 and 33 inhibit both transistors 34 and 36 from turning on. When $\overline{CAS}$ switches to a logic low, transistors 32 and 33 no longer inhibit transistors 34 and 36 so that one of transistors 34 and 36 turns on in response to signals DB and $\overline{DB}$ to provide data input signal DO. Consequently, the delays associated with switching flip-flop 23, enabling latch 18, and propagating a data bit through output buffer 12 are all achieved while $\overline{CAS}$ is a logic high instead of after $\overline{CAS}$ switches to a logic low. Accordingly, there is a reduced amount of time from when $\overline{CAS}$ switches to a logic low until output data signal DO is valid. Previously, the flip-flop which enabled the next data latch in the nibble mode sequence, did not switch states until $\overline{CAS}$ went to a logic low. Consequently, there were several propagation delays after $\overline{CAS}$ switched to a logic low, before a data bit reached the input of a tri-state driver.

After providing the data bit stored in data latch 18, from the second quadrant 28 as output data signal DO, the next data bit provided is from data latch 19. $\overline{CAS}$ switches to a logic high causing tri-state driver 13 to provide a high impedance output, and flip-flop 24 to switch signal F24 from a logic low to a logic high which in turn causes signal F23 to switch to a logic low. Signal F24 at a logic high enables latch 19 to provide the data bit stored therein to output buffer 12 via lines 32 and 33 as internal data signals DI and $\overline{DI}$. Output buffer 12 drives signals DB and $\overline{DB}$ into tri-state driver 13 where signals DB and $\overline{DB}$ are inhibited until $\overline{CAS}$ switches to a logic low. When $\overline{CAS}$ switches to a logic low, tri-state driver 13 provides output data signal DO as driven by signals DB and $\overline{DB}$. Signal DO remains representative of the data bit stored in latch 19 until $\overline{CAS}$ switches to a logic high.

In response to $\overline{CAS}$ switching to a logic high, tri-state driver 13 provides a high impedance output, flip-flop 26 switches signal F26 from a logic low to a logic high which in turn causes signal F24 to switch to a logic low. Signal F26 at a logic high enables latch 21 to provide the data bit stored therein to output buffer 12 via lines 32 and 33 as internal data signals DI and $\overline{DI}$. Output buffer 12 drives signals DB and $\overline{DB}$ into tri-state driver 13 where signals DB and $\overline{DB}$ are inhibited until $\overline{CAS}$ switches to a logic low. When $\overline{CAS}$ switches to a logic low, tri-state driver 13 provides output data signal DO as driven by signals DB and $\overline{DB}$. Signal DO remains representative of the data bit stored in data latch 21 until $\overline{CAS}$ switches to a logic high.

The signal sequence of FIG. 3 shows that for a single address, four data bits can be provided serially. The single address A for defining the location of a single data bit, in this case, comprises one column address and one row address. As shown in FIG. 3, internal data signals DI and $\overline{DI}$ are valid prior to the falling edge of $\overline{CAS}$ instead of subsequent to the falling edge of $\overline{CAS}$ as in the prior art. The most significant bit for each of the column and row address determines which one of latch enable signals F22, F23, F24, and F26 is provided at a logic high to select the first data latch to provide the first data bit in the serial data provided. In the case of a 256K DRAM where there are 262,144 possible stored bits, there are 9 address bits, A0, A1, A2, A3, A4, A5, A6, A7, and A8, for each of the row and column address. Address bits A0-A7 determine which four bits from quadrants 27, 28, 29 and 31 are stored in data latches 17, 18, 19 and 21, respectively. Address bit A8 determines which of these quadrants provides the first data bit in the serial sequence of data bits provided as signal DO. Although the quadrant 27, 28, 29 and 31 which provides the first data bit is selectable, the sequence is the same. The data bit from second quadrant 28 follows the data bit from first quadrant 27, the data bit from third quadrant 29 follows the data bit from second quadrant 28, the data bit from fourth quadrant 31 follows the data bit from third quadrant 29, and the data bit from first quadrant 27 follows the data bit from fourth quadrant 31. For example, if address A, via address A8, selects flip-flop 24 to provide signal F24 at a logic high, then data latch 19 will be enabled so that the first data bit in the serial sequence will be from third quadrant 29. The next data enable signals to switch to a logic high, in order, will be signal F26, signal F22, and signal F23 which will enable, in order, data latch 21, data latch 17, and data latch 18 so that data bits following the data bit from third quadrant 29 will be from, in order, fourth quadrant 31, first quadrant 27, and second quadrant 28.

Figure 2:
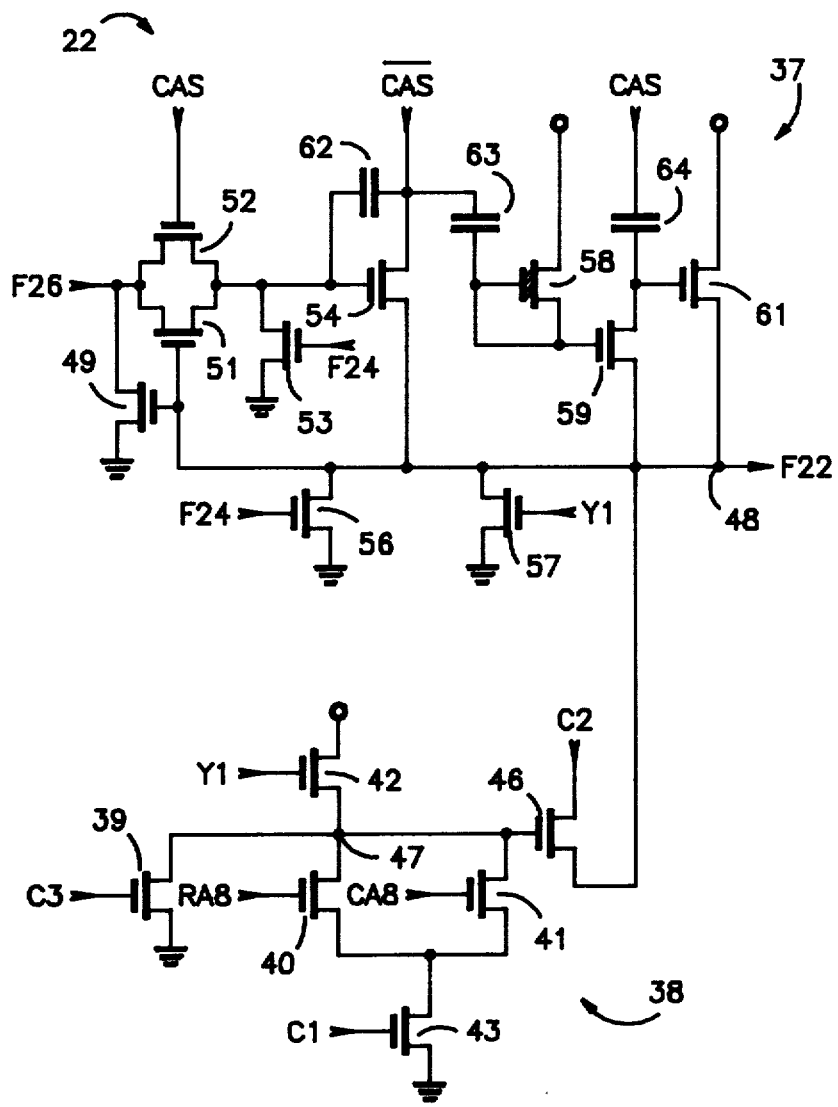
FIG. 2 is a circuit diagram of a flip-flop used in the preferred embodiment of FIG. 1.

Flip-flops 22, 23, 24 and 26 are the same circuit configuration. The circuit diagram for flip-flop 22 which is shown in FIG. 2, accordingly is also the configuration for flip-flops 23, 24, and 26. As shown in FIG. 2, there are a number of additional signals coupled to flip-flop 22 which are not shown in FIG. 1 to avoid overcrowding FIG. 1. Flip-flop 22 is comprised generally of a shift register portion 37 and a decoder portion 38. Decoder portion 38 comprises transistor 39, transistor 40, transistor 41, transistor 42, transistor 43 and transistor 46. Decoder portion 38 receives a clock signal C1, a clock signal C2, a clock signal C3, a precharge signal Y1, a latched row address signal RA8, and column address signal CA8. As shown in FIG. 3, after $\overline{RAS}$ switches to a logic low, clock signal C1 switches to a logic high in response to $\overline{CAS}$ switching to a logic low. Clock signal C1 remains at a logic high until $\overline{RAS}$ switches to a logic high. There is a time delay from when $\overline{CAS}$ switches to a logic low to when clock signal C1 switches to a logic high. As shown in FIG. 3, clock signal C2 is the same as clock signal C1 except that there is a time delay from when clock signal C1 switches to a logic high to when clock signal C2 switches to a logic high. Clock signal C3 (not shown) is the same as clock signal C2 except that there is a time delay from when clock signal C2 switches to a logic high to when clock signal C3 switches to a logic high. As shown in FIG. 3, after $\overline{RAS}$ switches to a logic low, precharge signal Y1 switches from a logic high to a logic low in response to $\overline{CAS}$ switching to a logic low. Precharge signal Y1 switches back to a logic high in response to $\overline{RAS}$ switching to a logic high. Latched row address signal RA8 is the address bit A8 which is received during the row address portion of address A and is latched. Column address signal CA8 is the address bit A8 which is received during the column address portion of address A.

Transistor 39 has a drain connected to a node 47, a source connected to ground, and a gate for receiving signal C3. Transistor 40 has a drain connected to node 47, a gate for receiving signal RA8, and a source. Transistor 41 has a drain connected to node 47, a source connected to the source of transistor 40, and a gate for receiving signal CA8. Transistor 42 has a drain connected to power supply terminal $V_{DD}$, a source connected to node 47, and a gate for receiving signal Y1. Transistor 43 has a drain connected to the source of transistor 41, a source connected to ground, and a gate for receiving signal C1. Transistor 46 has a gate connected to node 47, a drain for receiving signal C2, and a source connected to a node 48 which is the output of flip-flop 22.

In the case where flip-flop 22 is to provide signal F22 at a logic high in response to address A, decoder portion 38 provides a logic high output on node 48 where it is held at a logic high by capacitance associated with node 48. Node 47 is precharged by transistor 42 in response to signal Y1. Both signals RA8 and CA8 will be at a logic low when transistor 43 turns on in response to signal C1 switching to a logic high. With both signals RA8 and CA8 at a logic low, transistors 40 and 41 will not turn on so that node 47 will remain charged, keeping transistor 46 turned on. Signal C2, via transistor 46, is then coupled to node 48 where it is held by the capacitance associated therewith to provide signal F22 at a logic high. Signal C3 then turns on transistor 39 to discharge node 47 to ground, turning off transistor 46. Signal F22 is maintained at a logic high by shift register portion 37. Node 47 will remain discharged, keeping transistor 46 off, until $\overline{RAS}$ switches to a logic high.

In the case where one of flip-flops 23, 24 and 26 is to be the first in the sequence to provide a logic high output, at least one of signals RA8 and CA8 will be a logic high so that at least one of transistors 40 and 41 will be turned on to discharge node 47 to ground via transistor 43 when signal C1 turns transistor 43 on. With node 47 grounded, the gate of transistor 46 will also be coupled to ground so that transistor 46 will be turned off when signal C2 switches to a logic high. In which case signal C2 is not coupled to node 48 so that signal F22 is maintained at a logic low. Signal C3 again ensures that transistor 46 remains off until $\overline{RAS}$ switches to a logic high.

Signals RA8 and CA8 and their complements $\overline{RA8}$ and $\overline{CA8}$ have four possible combinations. Flip-flops 23, 24 and 26 use the remaining three combinations of these signals in respective decoder portions to provide signals F23, F24 and F26 as required in response to address A. Otherwise, the decoder portion of each flip-flop 23, 24 and 26 is the same as that for flip-flop 22. The decoder portion in effect establishes a set condition wherein one of the flip-flops 22, 23, 24 and 26 is set to a logic high as determined by the respective decoder portions in response to address A.

Shift register portion 37 receives signal F26, $\overline{CAS}$ and a CAS signal, signal F24 and signal Y1. $\overline{CAS}$ and CAS are complementary to each other. Shift register portion 37 is comprised of a transistor 49, a transistor 51, a transistor 52, a transistor 53, a transistor 54, a transistor 56, a transistor 57, a transistor 58, a transistor 59, a transistor 61, a capacitor 62, a capacitor 63, and a capacitor 64. Transistor 58 is a depletion transistor with a threshold voltage from −2.0 to −2.5 volts. Transistor 49 has a source connected to ground, a gate connected to node 48, and a drain. Transistor 51 has a drain connected to the drain of transistor 49 at which signal F26 is received, a gate connected to node 48, and a source. Transistor 52 has drain connected to the drain of transistor 51, a gate for receiving CAS, and a source connected to the source of transistor 51. Transistor 53 has drain connected to the source of transistor 51, a gate for receiving signal F24, and a source connected to ground. Transistor 54 has a source connected to node 48, a gate connected to the source of transistor 51, and drain for receiving $\overline{CAS}$. Capacitor 62 is connected between the gate and drain of transistor 54. Transistor 56 has a gate for receiving signal F24, a drain connected to node 48, and a source connected to ground. Transistor 57 has a drain connected to node 48, a gate for receiving signal Y1, and a source connected to ground. Transistor 58 has a drain connected to terminal $V_{DD}$, and a source and a gate connected together. Capacitor 63 has a first terminal for receiving $\overline{CAS}$ and a second terminal connected to the gate of transistor 58. Transistor 59 has a gate connected the source of transistor 58, a source connected to node 48, and a drain. Capacitor 64 has a first terminal for receiving CAS and a second terminal connected to the drain of transistor 59. Transistor 61 has a gate connected to the drain of transistor 59, a drain connected to terminal $V_{DD}$, and a source connected to node 48.

When flip-flop 22 is to provide signal F22 in response to address A, node 48 is coupled to ground by transistor 57 in response to signal Y1 prior to receiving signal C2 from decoder portion 38. Just after $\overline{CAS}$ switches to a logic low, turning transistor 57 off. All of the transistors having a source or drain connected to node 48 are then off. Signal C2 is coupled to node 48 to provide signal F22 at a logic high. After transistor 46 turns off, signal F22 is held at a logic high by the capacitance associated with node 48.

In the case where signal F26 is high, indicating that signal F22 is to switch to a logic high on the next rising edge of $\overline{CAS}$, transistor 54 holds signal F22 at a logic low until $\overline{CAS}$ switches to a logic high. Signal F26 is coupled to the gate of transistor 54 and capacitor 62 via transistor 52 due to $\overline{CAS}$ being at a logic high. Transistor 54 is turned on with $\overline{CAS}$ being at a logic low, ensuring signal F22 is at a logic low. When $\overline{CAS}$ switches to a logic high, transistor 52 turns off due to CAS switching to a logic low, leaving capacitor 62 charged. $\overline{CAS}$ switching to a logic high further increases the voltage on the gate of transistor 54 so that transistor 54 will couple the entire amplitude of $\overline{CAS}$ to node 48, causing signal F22 to switch to a logic high. Consequently the output of flip-flop 22 provides a logic high upon the rising edge of $\overline{CAS}$. In response to signal F22 switching to a logic high, transistor 49 turns on which pulls signal F26 to a logic low. Transistor 51 then turns on to discharge the gate of transistor 54 so that transistor 54 will be off prior to $\overline{CAS}$ switching to a logic low. The capacitance associated with node 48 holds signal F22 at a logic high. When $\overline{CAS}$ next switches to a logic low, transistor 59 is temporarily turned off by the capacitive coupling of capacitor 63 between $\overline{CAS}$ and the gate of transistor 59. Transistor 59 is normally turned on by depletion load transistor 58 so that the gate of transistor 61 has been charged by the logic high present on node 48. Thus, when CAS switches to a logic high, the gate of transistor 61 is elevated even further in voltage by the coupling of capacitor 64 so that transistor 61 couples the full voltage present at terminal $V_{DD}$ to be coupled to node 48. This ensures that signal F22 will not be adversely effected by $\overline{CAS}$ switching to a logic low. When $\overline{CAS}$ next switches to a logic high, flip-flop 23 of FIG. 1 causes signal F23 to switch to a logic high. When Flip-flop 23 next switches to a logic low, signal F24 will have switched to a logic high turning on transistors 56 and 53. Transistor 56 ensures that signal F22 will remain at a logic low while signal F24 is a logic high. Transistor 53 ensures that transistor 54 will not turn on by keeping the gate thereof coupled to ground. On the rising edge of $\overline{CAS}$ which causes signal F26 to switch to a logic high, transistor 53 is held on long enough to ensure there is no accumulation of charge on the gate of transistor 54 which could turn on transistor 54. When signal F24 switches to a logic low in response to signal F26 switching to a logic high, there is nothing to cause node 48 to rise in voltage so that the capacitance of node 48 holds signal F22 at a logic low. When $\overline{CAS}$ next switches to a logic low, transistor 54 is turned on by logic high signal F26 being coupled through transistor 52. Transistor 54 thus holds node 48 at logic low because $\overline{CAS}$ is a logic low. Flip-flops 23, 24 and 26 have analogous signal connections for analogous transistors 53 and 56. For these two analogous transistors, flip-flop 23 receives signal F26, flip-flop 24 receives signal F22, and flip-flop 26 receives signal F23.

It is to be understood that, whereas in a typical DRAM a $\overline{CAS}$ signal is provided from an external source to an external pin, $\overline{CAS}$ and CAS described and shown herein may be buffered. While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. In a memory for providing a plurality of data bits in response to a single address and providing the plurality of data bits in serial form in response to a data valid signal on an output terminal, a circuit comprising:
   output means coupled to a common data bus for providing a data bit on the output terminal in response to each occurrence of the data valid signal;
   a plurality of data latches coupled to the common data bus, each data latch containing data bit which is coupled to the data bus in response to receiving a data latch enable signal associated therewith; and
   a plurality of interconnected flip-flops responsive to removal of the data valid signal for providing each of the data latch enable signals to the data latch with which it is associated in a predetermined sequence,
   wherein a particular data latch is enabled by receiving the data latch enable signal with which it is associated sufficiently prior to the output means receiving the data valid signal so that the output means has received the data contained in the particular data latch on the common data bus prior to receiving the data valid signal.

2. A method for clocking data out of a memory system which has a plurality of data latches coupled to an output driver for selectively coupling data thereto in response to outputs provided by a plurality of registers coupled to the data latches, comprising:
   clocking a first register on the rising edge of a first pulse of a column address signal so that the first register provides an output;

using the output from the first register to gate data out of a first data latch and through the output driver so that the output driver provides output data substantially on the falling edge of the first pulse;

inhibiting the first register and clocking a second register with a second pulse of the column address signal so that the second register provides an output;

using the output from the second register to gate data out of a second data latch and through the output driver so that the output driver provides output data substantially on the falling edge of the second pulse;

inhibiting the second register and clocking a third register with a third pulse of the column address signal so that the third register provides an output signal;

using the output from the third register to gate data out of a third data latch and through the output driver so that the output driver provides output data substantially on the falling edge of the third pulse; and continuing inhibiting a previous register and clocking a succeeding register until all the registers have been clocked and then commencing with the first register again.

3. A circuit for providing serial data responsive to a data valid signal on an output terminal from a memory in response to a single address, comprising:

output means coupled to a common data bus for coupling a data bit received from said data bus to the output terminal in response to the data valid signal switching from a first level to a second level;

a plurality of data latches each coupled to the data bus, each data latch containing a data bit which is coupled to the data bus in response to receiving a data latch enable signal associated therewith; and a plurality of interconnected flip-flops responsive to at least a portion of the address for providing a first data latch enable signal as determined by the address to the data latch associated with the first data latch enable signal prior to the data valid signal switching from a first level to a second level, providing a second data latch enable signal the data latch associated with the second data latch enable signal in response to the data valid signal switching from the second level to the first level, and removing the first data latch enable signal in response to providing the second data latch enable signal.

4. The circuit of claim 3 further comprising a buffer circuit interposed between the data bus and the output means.

5. The circuit of claim 4 wherein the plurality of data latches is further characterized as comprising first, second, third, and fourth data latches which couple a data bit to the data bus in response to first, second, third, and fourth data latch enable signals respectively; and wherein the plurality of interconnected flip-flops is further characterized as comprising first, second, third, and fourth flip-flops, for sequentially providing the first, second, third, and fourth data latch enable signals.

6. The circuit of claim 5, wherein:

the first flip-flop has a first input for receiving the data valid signal, a second input, and an output for providing the first data latch enable signal;

the second flip-flop has a first input for receiving the data valid signal, a second input coupled to the output of the first flip-flop, and an output for providing the second data latch enable signal;

the third flip-flop has a first input for receiving the data valid signal, a second input coupled to the output of the second flip-flop, and an output for providing the third data latch enable signal; and the fourth flip-flop has a first input for receiving the data valid signal, a second input coupled to the output of the third flip-flop, and an output coupled to the second input of the first flip-flop for providing the fourth data latch enable signal; and wherein each flip-flop provides its respective data latch enable signal in response to the data valid signal switching from the second level to the first level when a data latch enable signal is present on its second input.

* * * * *

UNITED STATES PATENT AND TRADEMARK OFFICE
CERTIFICATE OF CORRECTION

PATENT NO. : 4,484,308
DATED : November 20, 1984
INVENTOR(S) : Alan J. Lewandowski et al It is certified that error appears in the above-identified patent and that said Letters Patent is hereby corrected as shown below:

In claim 3, line 18, insert -- to -- between "signal" and "the".

Signed and Sealed this

Thirtieth Day of April 1985

[SEAL]

Attest:

DONALD J. QUIGG

Attesting Officer     Acting Commissioner of Patents and Trademarks